(12) United States Patent
Chow et al.

(10) Patent No.: US 8,964,490 B2
(45) Date of Patent: Feb. 24, 2015

(54) WRITE DRIVER CIRCUIT WITH LOW VOLTAGE BOOTSTRAPPING FOR WRITE ASSIST

(71) Applicant: Apple Inc., Cupertino, CA (US)

(72) Inventors: Daniel C Chow, Austin, TX (US); Hang Huang, Sunnyvale, CA (US); Ajay Kumar Bhatia, Saratoga, CA (US); Steven C Sullivan, Austin, TX (US)

(73) Assignee: Apple Inc., Cupertino, CA (US)

( * ) Notice: Subject to any disclaimer, the term of this patent is extended or adjusted under 35 U.S.C. 154(b) by 18 days.

(21) Appl. No.: 13/761,646

(22) Filed: Feb. 7, 2013

(65) Prior Publication Data

US 2014/0219009 A1    Aug. 7, 2014

(51) Int. Cl.
  G11C 7/12      (2006.01)
  G11C 7/10      (2006.01)
  G11C 5/14      (2006.01)
  G11C 11/419   (2006.01)

(52) U.S. Cl.
  CPC .............. *G11C 7/1096* (2013.01); *G11C 5/145* (2013.01); *G11C 11/419* (2013.01)
  USPC ............ 365/189.16; 365/189.11; 365/189.02; 365/230.03; 365/156; 365/190; 365/228

(58) Field of Classification Search
  USPC ............. 365/189.16, 189.11, 189.06, 189.02, 365/230.03, 156, 154, 190, 228, 226
  See application file for complete search history.

(56) References Cited

U.S. PATENT DOCUMENTS

| | | | |
|---|---|---|---|
| 7,457,181 B2 * | 11/2008 | Lee et al. ...................... | 365/208 |
| 7,486,540 B2 * | 2/2009 | Gouin et al. .................. | 365/154 |
| 8,120,975 B2 | 2/2012 | Kenkare et al. | |
| 8,411,518 B2 * | 4/2013 | Janardan et al. .............. | 365/194 |
| 2007/0109878 A1 * | 5/2007 | Gouin et al. ............. | 365/189.11 |
| 2011/0058411 A1 | 3/2011 | Rim | |
| 2012/0170391 A1 | 7/2012 | Janardan et al. | |

* cited by examiner

*Primary Examiner* — Andrew Q Tran
(74) *Attorney, Agent, or Firm* — Meyertons, Hood, Kivlin, Kowert & Goetzel, P.C.

(57) ABSTRACT

Embodiments of a memory are disclosed that may allow for a negative boost of data lines during a write. The memory device may include a data input circuit, an address decode circuit and a plurality of sub-arrays. Each of the sub-arrays may include a plurality of columns, a write selection circuit, a first write driver circuit, a second write driver circuit, and a boost circuit. Each of the columns may include a plurality of data storage cells. The write selection circuit may select a column of the plurality of columns. Each of the write driver circuits may be configured to discharge a data line of a selected column into a common node. The boost circuit may be configured to initialize the common node to the first voltage level and couple the common node to a second voltage level, where the second voltage level is lower than the first voltage level.

18 Claims, 8 Drawing Sheets

WRITE DRIVER CIRCUIT WITH LOW VOLTAGE BOOTSTRAPPING FOR WRITE ASSIST

BACKGROUND

1. Technical Field

This invention is related to the field of integrated circuit implementation, and more particularly to the implementation of memories.

2. Description of the Related Art

Computing systems may include one or more systems on a chip (SoC), which may integrate a number of different functions, such as, graphics processing, onto a single integrated circuit. With numerous functions included in a single integrated circuit, chip count may be kept low in mobile computing systems, such as tablets, for example, which may result in a smaller form factor for such mobile computing systems.

Memories, such as those included in SoC designs, typically include a number of data storage cells arranged in an array, and composed of transistors fabricated on a semiconductor substrate. Such data storage cells may be constructed according to a number of different circuit design styles. For example, the data storage cells may be implemented as a single transistor coupled to a capacitor to form a dynamic storage cell. Alternatively, cross-coupled inverters may be employed to form a static storage cell, or a floating gate metal-oxide semiconductor field-effect transistor (MOSFET) may be used to create a non-volatile memory.

As semiconductor process technology has continued to evolve, thicknesses of various insulating layers on a semiconductor have reduced in response to smaller device geometries. In order to accommodate such insulating layers, power supply voltages have been lowered to limit the strain resulting from electric fields applied across the insulating layers. Moreover, the smaller device geometries may result in additional device-to-device variation in the electrical characteristics of MOSFETs within an integrated circuit due to differences in lithography, dopant levels, and the like.

In some cases, power supply voltages have been reduced to the point where some circuits do not perform as intended, or margin previously present in a circuit design may no longer be available. Memories, such as those described above, may be sensitive to these lower power supply voltages. Lower power supply voltages in conjunction with manufacturing variation in MOSFETs within a memory, may result in memory sub-circuits, such as, e.g., sense amplifiers or data storage cells, not operating as intended.

SUMMARY OF THE EMBODIMENTS

Various embodiments of a memory circuit are disclosed. Broadly speaking, a circuit and a method are contemplated in which a memory circuit includes a data input circuit, an address decode circuit, and a plurality of sub-arrays. The data input circuit may be configured to latch input data to be stored in the memory circuit, and the address decode circuit may be configured to activate one of a plurality of column selections signals dependent upon decoding an input address to the memory circuit. Each of the sub-arrays may include a plurality of columns, a write selection circuit, a first write driver to circuit, a second write driver circuit, and a boost circuit. Each of the columns may include a plurality of data storage cells. The write selection circuit may be configured to select one of the columns dependent upon the column selection signals. The first and second write driver circuits may be configured to discharge, dependent on the latched input data, a data line of a selected column into node common between the two write driver circuits. The boost circuit may be configured to initialize the common node to a first voltage level and couple the common node to a second voltage level, where the second voltage level is lower than the first voltage level.

In one embodiment, the boost circuit may include a plurality of capacitors coupled to the common node. Each of the capacitors may be further coupled to a respective boost node of a plurality of boost nodes. In a further embodiment, each of the capacitors may be a metal-oxide semiconductor field-effect transistor (MOSFET).

In one particular embodiment, the boost circuit may be further configured to initialize each one of the plurality of boost nodes. The boost nodes may be initialized to a third voltage level.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

Memories, along with microcontrollers and other functional blocks, may be included in a system on a chip (SoC) to integrate the function of a computing system onto a single integrated circuit. When included in an SoC, memories may be used to store program instructions to be executed by a microcontroller or processor, or data to be operated on. In some cases, memories may be included in SoCs as separate functional blocks, in addition to being included as sub-blocks within other functional blocks such as, cache memories within a processor, for example.

In some applications, such as, e.g., mobile computing, in an effort to conserve power, the level of the power supply voltage may be lowered to one or more functional blocks within an SoC during periods of inactivity or reduced activity. Operating at with a reduced power supply voltage level may present challenges for one of more the functional blocks of a SoC.

Some memory designs may have difficulty performing storing data into data storage cells at lower power supply voltage levels. In some cases, the time required to store data into data storage cells may exceed desired operating specifications. Improved write characteristics, such as, e.g., the time required to store data in a data storage cell, may be achieved accomplished by bootstrapping the voltage level of a data line below the ground reference level. The embodiments illustrated in the drawing and described below may provide techniques for implementing a data line bootstrap below ground.

System-on-a-Chip Overview

Figure 1:
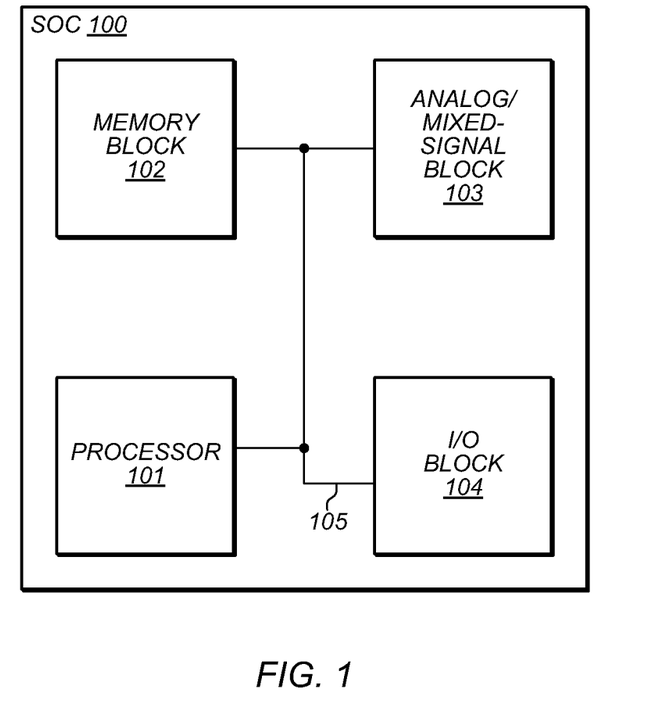
FIG. 1 illustrates an embodiment of a system-on-a-chip.

A block diagram of an SoC is illustrated in FIG. 1. In the illustrated embodiment, the SoC 100 includes a processor 101 coupled to memory block 102, and analog/mixed-signal block 103, and I/O block 104 through internal bus 105. In various embodiments, SoC 100 may be configured for use in a mobile computing application such as, e.g., a tablet computer or cellular telephone. Transactions on internal bus 105 may be encoded according to one of various communication protocols. For example, transactions may be encoded using Advanced Extensible Interface (AXI), Peripheral Component Interconnect Express (PCIe), or any other suitable communication protocol.

Processor 101 may, in various embodiments, be representative of a general-purpose processor that performs computational operations. For example, processor 101 may be a central processing unit (CPU) such as a microprocessor, a microcontroller, an application-specific integrated circuit (ASIC), or a field-programmable gate array (FPGA). In some embodiments, processor 101 may include one or more register files and memories.

In some embodiments, processor 101 may implement any suitable instruction set architecture (ISA), such as, e.g., the ARM™, PowerPC™, or x86 ISAs, or combination thereof. Processor 101 may include one or more bus transceiver units that allow processor 101 to communication to other functional blocks within SoC 100 such as, memory block 102, for example.

Memory block 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, Phase Change Memory (PCM), or a Ferroelectric Random Access Memory (FeRAM), for example. In some embodiments, memory block 102 may be configured to store program code or program instructions that may be executed by processor 101. Memory block 102 may, in other embodiments, be configured to store data to be processed, such as graphics data, for example.

It is noted that in the embodiment of an SoC illustrated in FIG. 1, a single memory block is depicted. In other embodiments, any suitable number of memory blocks and memory types may be employed.

Analog/mixed-signal block 103 may include a variety of circuits including, for example, a crystal oscillator, a voltage reference, a current reference, a phase-locked loop (PLL) or delay-locked loop (DLL), an analog-to-digital converter (ADC), and a digital-to-analog converter (DAC) (all not shown). In other embodiments, analog/mixed-signal block 103 may be configured to perform power management tasks with the inclusion of on-chip power supplies, voltage regulators, and clock frequency scaling circuitry. Analog/mixed-signal block 103 may also include, in some embodiments, radio frequency (RF) circuits that may be configured for operation with cellular telephone networks.

I/O block 104 may be configured to coordinate data transfer between SoC 101 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O block 104 may be configured to implement a version of Universal Serial Bus (USB) protocol or IEEE 1394 (Firewire®) protocol, and may allow for program code and/or program instructions to be transferred from a peripheral storage device for execution by processor 101.

I/O block 104 may also be configured to coordinate data transfer between SoC 301 and one or more devices (e.g., other computer systems or SoCs) coupled to SoC 100 via a network. In one embodiment, I/O block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O block 104 may be configured to implement multiple discrete network interface ports.

Each of the functional blocks included in SoC 100 may be included in separate power and/or clock domains. In some embodiments, a functional block may be further divided into smaller power and/or clock domains. Each power and/or clock domain may, in some embodiments, be separately controlled thereby selectively deactivating (either by stopping a clock signal or disconnecting the power) individual functional blocks or portions thereof.

It is noted that the SoC illustrated in FIG. 1 is merely an example. In other embodiments, different functional blocks and different configurations of functions blocks may be possible dependent upon the specific application for which the SoC is intended.

Memory Architecture and Operation

Figure 2:
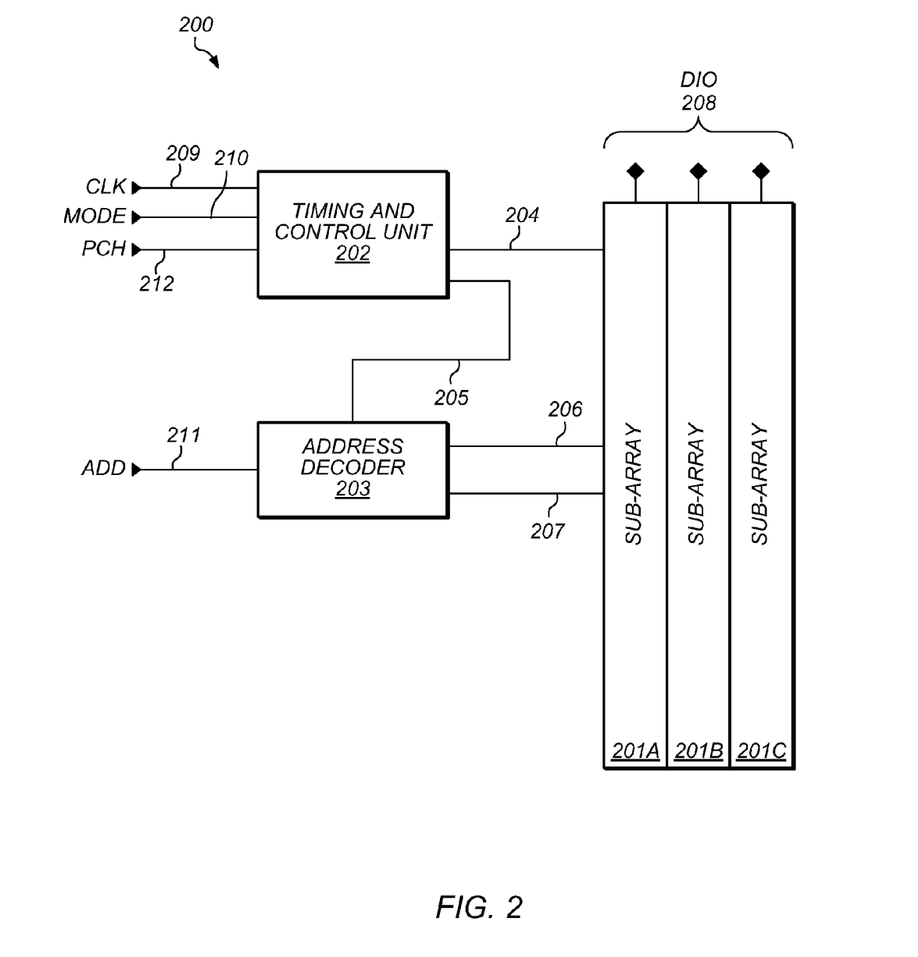
FIG. 2 illustrates an embodiment of a memory device.

Turning to FIG. 2, a memory is illustrated according to one of several possible embodiments. In some embodiments, memory 200 may correspond to memory block 102 as depicted in FIG. 1. The illustrated embodiment includes data I/O ports 208 denoted as "dio," an address bus input 211 denoted "add," mode selection input 210 denoted as "mode," pre-charge control input 212 denoted as "pch," and clock input 209 denoted as "clk."

In the illustrated embodiment, memory 200 includes sub-arrays 201a, 201b, and 201c, timing and control unit 202, and address decoder 203. Timing and control unit 202 is coupled to provide a decoder enable signal 205 to address decoder 203, and control signals 204 to sub-arrays 201a-201c. In some embodiments, control signals 204 may include a sense amplifier enable signal, an output enable signal, and data input latch signal, and a pre-charge signal. The pre-charge signal may, in other embodiments, included multiple signals that may be dependent on the column selection signals 207.

Timing and control block 202 may include a state machine or state logic, and may be configured to provide control signals 204 dependent upon the status of the state machine or state logic as well as clock input 209, mode selection input 210, and pre-charge control input 212. In some embodiments, timing and control block 202 may include a decode circuit to determine the operating mode of memory 200, such as, e.g., a data storage or "write" operation, dependent upon the state of mode selection input 210. In other embodiments, timing and control block 202 may include registers configured to store previous states of mode selection input 210. A comparator configured to compare the state of mode selection input 210 to a previously stored state of mode selection input 210 may be included in timing and control block 202.

In other embodiments, the function performed by timing and control block 202 may be performed external to memory 200 by a processor, such as, e.g., processor 101 of SoC 100 as illustrated in FIG. 1. In such cases, control signals 204 may be directly supplied to memory 200 by processor 101.

Address decoder 203 is coupled to provide row selection signals 206 and column selection signals 207, in response to the assertion of decoder enable signal 205 and dependent upon the address value encoded on address bus input 211. In some embodiments, row decoder 203 may employ a n-to-2$^n$ decoding scheme, where n is the number of bits in the address value encoded on address bus input 211, or any suitable decoding scheme, to generate row selection signals 206 and column selection signals 207. The decoding scheme may be employed on a portion of the data bits included in address bus input 211 to generate row selection signals 206. The remaining data bits included in address bus input 211 may be decoded to generated column selection signals 207. Column selection signals 207 may, in various embodiments, be differentially encoded. In other embodiments, different address values may be encoded on address bus input 211 in a time-domain multiplex fashion, and address decoder 202 may be operated at different times to generate row selection signals 206 and column selection signals 207 in accordance with the time-domain multiplexing.

The decoding scheme of row decoder 203 may be implemented in accordance with one of various design styles. In some embodiments, row decoder 203 may employ a dynamic decoder in which a series of circuit nodes are pre-charged to a pre-determined voltage and one of the circuit nodes is selectively discharged dependent on the value encoded on address bus input 211. Address decoder 203 may, in various embodiments, include latches or flip-flops configured to store the values on address bus input 211 prior to the generation of row selection signals 206 and column selection signals 207.

It is noted that the memory illustrated in FIG. 2 is merely an example. In other embodiments, different numbers of memory sub-arrays, and different number of functional blocks are possible and contemplated.

Figure 3:
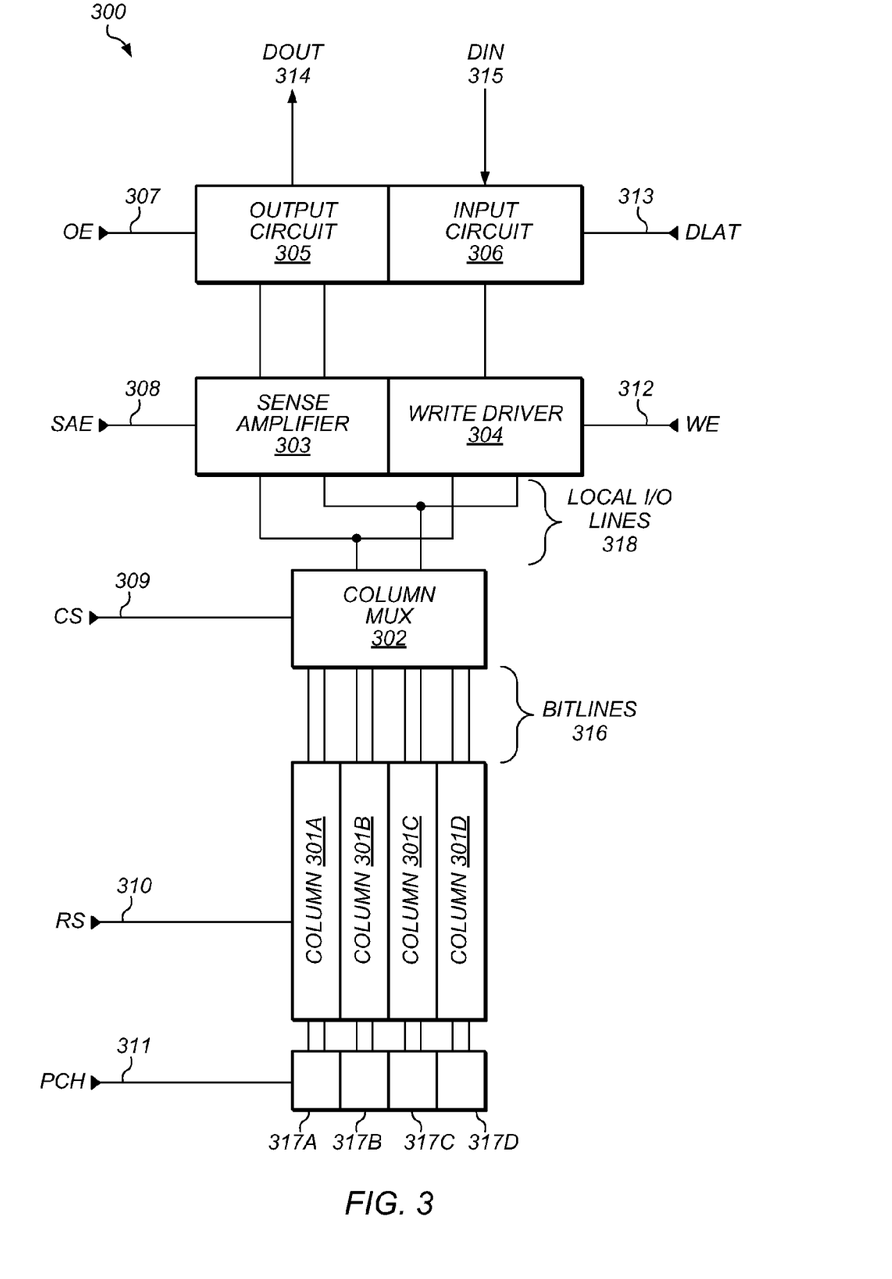
FIG. 3 illustrates an embodiment of a memory sub-array.

FIG. 3 illustrates an embodiment of a memory sub-array, which may, in some embodiments, correspond to sub-arrays 201a-201c as depicted in FIG. 2. In the illustrated embodiment, sub-array 300 includes a data output 314 denoted as "dout," a data input 315 denote as "din," an output enable input 307 denote as "oe," a sense amplifier enable input 308 denoted as "sae," a data latch control input 313 denoted as "dlat," and a write enable input 312 denoted as "we." The illustrated embodiment also includes one or more column selection input 308 denoted as "cs" one or more row selection inputs 310 denoted as "rs," and a pre-charge enable input 311 denoted as "pch."

In the illustrated embodiment, columns 301a, 301b, 301c, and 301d are coupled to the inputs of column multiplexer 302 through bit lines 316. Columns 301a, 301b, 301c, and 301d are also coupled to pre-charge circuits 317a, 317b, 317c, and 317d, respectively. The differentially encoded output of column multiplexer 302 is coupled to the differential inputs of sense amplifier 303, and the differential output of write driver 304 through local I/O lines 318. The output of sense amplifier 303 is coupled to the input of output circuit 305, and the input of write driver 304 is coupled to the output of input circuit 306.

Each column 301 may include one or more data storage cells, whose outputs are coupled to a common pair (a true bit line and a complement bit line) of bit lines 316 (also referred to as data lines). The data storage cells may be configured such that in response to the assertion of one of row selection inputs 310, a respective one of the data storage cells may output its stored data onto the pair of bit lines. In some embodiments, the data storage cells may be static storage cells, while in other embodiments, the data storage cells may be dynamic storage cells, single-bit or multi-bit non-volatile storage cells, or mask programmable read-only storage cells. It is noted that in some embodiments, the data storage cells may transmit data in a single-ended fashion. In such cases, only a single bit line per column may be required.

Each of pre-charge circuits 317a, 317b, 317c, and 317d may be configured to charge bit lines 316 to an initialization voltage in response to the assertion of pre-charge enable input 311. In some embodiments, the initialization voltage may be equivalent to the power supply voltage, while, in other embodiments, the initialization voltage may be an analog voltage level such as, half of the power supply voltage, for example.

In the illustrated embodiment, pre-charge circuits 317a, 317b, 317c, and 317d may be operated simultaneously. In other embodiments, each of the aforementioned pre-charge circuits may be operated independently, allowing for a subset of the bit lines 316 to be charged to the initialization voltage.

In some embodiments, column multiplexer 302 may contain one or more pass gates controllable by column selection inputs 308. Column multiplexer circuits, such as, e.g., column multiplexer 302, may also be referred to herein as a "column selection circuit" or a "write selection circuit." The input of each pass gate may be coupled to either the true or complement bit line output from one of columns 301a, 301b, 301c, or 301d. The output of each pass gate coupled to a true bit line may be coupled to the true output of column multiplexer 302 in a wired-OR fashion, and the output of each pass gate coupled to a complement bit line may be coupled to the complement output of column multiplexer 302 in a wired-OR fashion. In other embodiments, column multiplexer 302 may contain one or more logic gates configured to perform the multiplexer selection function.

It is noted that a pass gate (also referred to as a "transmission gate") may include an n-channel metal-oxide-semiconductor field-effect transistor (MOSFET) and a p-channel MOSFET connected in parallel. In other embodiments, a single n-channel MOSFET or a single p-channel MOSFET may be used as a pass gate. It is further noted that, in various embodiments, a "transistor" may correspond to one or more transconductance elements such as a junction field-effect transistor (JFET), for example.

Sense amplifier 303 may be configured to amplify the output of column multiplexer 302 according to one of a number of amplification techniques, such as a latched-based technique, for example. The output of sense amplifier 303 may be a digital signal, a single-ended analog signal, or any other suitable signal encoding the data selected by column multiplexer 302. In cases where the data storage cells of column 301a-301d transmit data in a single-ended fashion, sense amplifier 303 may be configured to amplify the single-ended data.

Write driver 304 may be configured to receive data from input circuit 306 and convert the receive data to a differentially encoded format for driving onto one of bit lines 316 selected by column multiplexer 302. In cases where the data storage cells of column 301a-301d receive data in a single-ended fashion, write driver 304 may be configured to drive single-ended data onto the selected bit line. In some embodiments, write driver 304 may include pre-charge circuits configured to initialize local I/O lines 318 to a pre-determined voltage. In some embodiments, the pre-determined voltage may be equivalent to the power supply voltage, while, in other embodiments, the pre-determined voltage may be an analog voltage level such as, half of the power supply voltage, for example.

Input circuit 306 may be configured to store data from data input 315 in response to the assertion of data latch control input 313. In some embodiments, data input 315 may be transmitted from a source in accordance with an interface standard such as low voltage transistor logic (LVTTL) and the like. In such cases, input circuit 306 may include a level translation circuit configured to convert the data received on data input 315 to logic levels and encoding style suitable for use with write driver 304.

Output circuit 305 may be configured to convert the differentially encoded output of sense amplifier 303 into single-ended data prior to output on data output 314 in accordance with any number of interface standards such as, LVTTL, low voltage complementary metal-oxide semiconductor (LVCMOS), low voltage differential signaling (LVDS), and the like. In some embodiments, output enable input 307 may control the impedance of output circuit 305, allowing for a high impedance state such that multiple circuits may be coupled to data output 314 in a wired-OR fashion.

It is noted that the sub-array illustrated in FIG. 3 is merely an example. In other embodiments, different circuit blocks and/or different arrangement of circuit blocks may be employed.

Write Circuits and Write Operation

Figure 4:
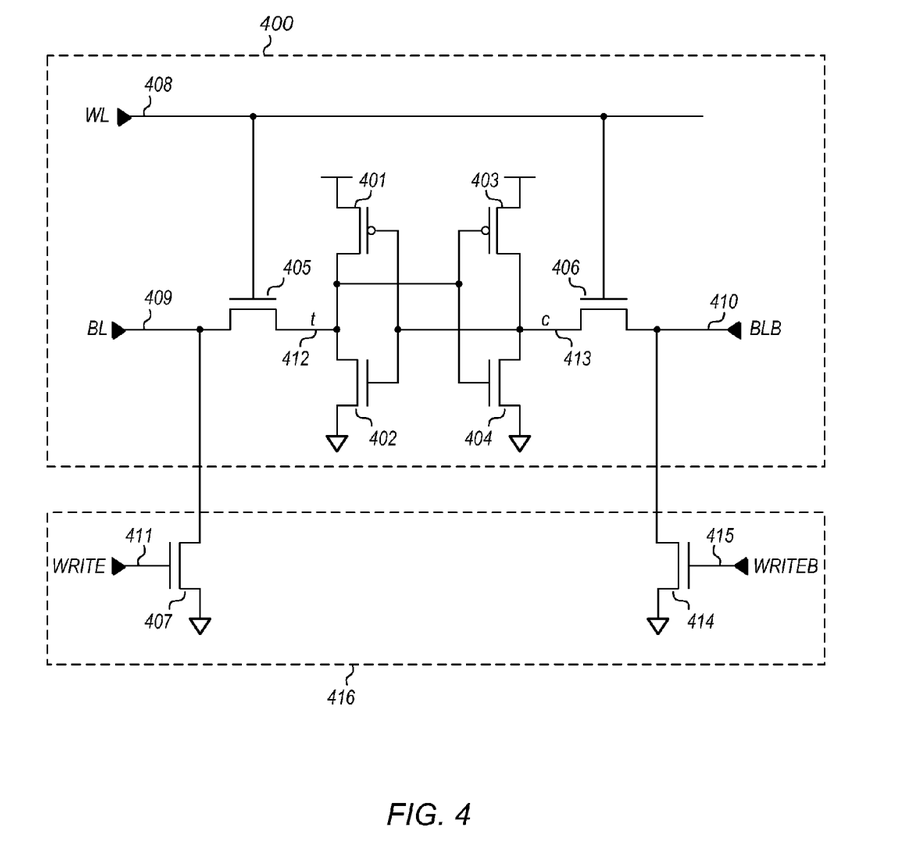
FIG. 4 illustrates an embodiment of a data storage cell during a data storage operation.

An embodiment of a data storage cell coupled to a write driver circuit is illustrated in FIG. 4. Data storage cell 400 may, in some embodiments, correspond to data storage cells included in columns 301a through 301d of sub-array 300 as depicted in FIG. 3, and write driver circuit 414 may, in some embodiments, correspond to write driver 304 of sub-array 300 as illustrated in FIG. 3. In the illustrated embodiment, write driver 400 includes word line signal 408 denoted as "wl," bit line 409 denoted as "bl," and complement bit line 410 denoted as "blb." It is noted that in some embodiments, a "bit line" may also be referred to as a "data line." Write driver circuit 416 includes write signal 411 denoted as "write," and complement write signal 415 denoted as "writeb."

Word line signal 408 controls devices 405 and 406 which are coupled to bit line 409 and complement bit line 410, respectively. Device 405 is further coupled to node 412, and device 406 is further coupled to node 413. Node 412 controls pull-up device 403 and pull-down device 404, and is further coupled to pull-up device 401 and pull-down device 402. Node 413 controls pull-up device 401 and pull-down device 402, and is further coupled to pull-up device 403 and pull-down device 404.

Write control signal 414 controls pull-down device 407 which is coupled to bit line 409. Complement write control signal 415 controls pull-down device 414 which is coupled to complement bit line 410.

It is noted that the term "device" may include one or more transistors, such as, e.g., MOSFETs, or any other suitable transconductance element. It is further noted that a pull-up device may include one or more devices coupled between a circuit node an a positive power supply, and that a pull-down device may include one or more devices coupled between a circuit node and a negative power supply or ground reference node.

When data storage cell 400 is not being accessed, word line 408 may be at a low logic level, and bit line 409 and complement bit line 410 may be at the voltage level of the power supply. Furthermore, write control signal 411 and complement write control signal 415 may both be a low logic level. In some embodiments, write control signal 411 and complement write control signal 415 may be a function of data to be stored such as, e.g., data input 315 as illustrated in FIG. 3.

To store data into data storage cell 400, word line 408 may be set to a high logic level, enabling devices 405 and 406. Once devices 405 and 406 have been enabled, one of write control signal 411 or complement write control signal 415 may be set to a high logic level dependent upon the logical polarity of the data to be stored, in order to enable one of devices 407 and 414. For example, to store a logical-0 into data storage cell 400, write control signal 411 may be switched to a high logic level enabling pull-down device 407.

In response to one of pull-down devices 407 and 414 being enabled, the corresponding bit line may be discharged to ground through the enabled pull-down device. Since devices 405 and 406 are both enabled, discharging bit line 409 or complement bit line 410 results in either node 412 or 413 being discharged as well. In cases where the internal node, i.e., node 412 or 413, being discharged is at a high logic level, the regenerative feedback between the pair of pull-up device 401 and pull-down device 402, and the pair of pull-up device 403 and pull-down device 404, further reinforce the discharging of the high logic level.

For example, when node 412 is at a high logic level and pull-down device 407 is active, node 412 is discharge through device 405 and pull-down device 407 into ground. The resulting low logic level on node 412 enables pull-up device 403, thereby charging node 413 to the voltage level of the power supply. The resulting high logic level on node 413 enables pull-down, further reinforcing the low logic level on node 412. Once this regenerative feedback has taken effect, word line 408 may be transitioned to a low logic level, deactivating devices 405 and 406. Write control signal may be set to a low logic level, turning off pull-down device 407. Bit line 409 may then, in some embodiments, be pre-charged to the voltage of the power supply.

In some embodiments, due to variation in a semiconductor manufacturing process, the combined impedance of device 405 and pull-down device 407 may be sufficiently close to the impedance of pull-up device 401, which may result in node 412 not being fully discharged. When this occurs, it may not be possible to change the logic state of data storage cell 400, or it may require a longer period of time to change the logic state of the data storage cell 400. In such cases, it may not be possible to reduce to voltage level of the power supply to desired levels for low voltage or power savings operation.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

Static complementary metal-oxide-semiconductor (CMOS) inverters, such as those shown and described herein, may be a particular embodiment of an inverting amplifier that may be employed in the circuits described herein. However, in other embodiments, any suitable configuration of inverting amplifier that is capable of inverting the logical sense of a signal may be used, including inverting amplifiers built using technology other than CMOS.

Figure 5:
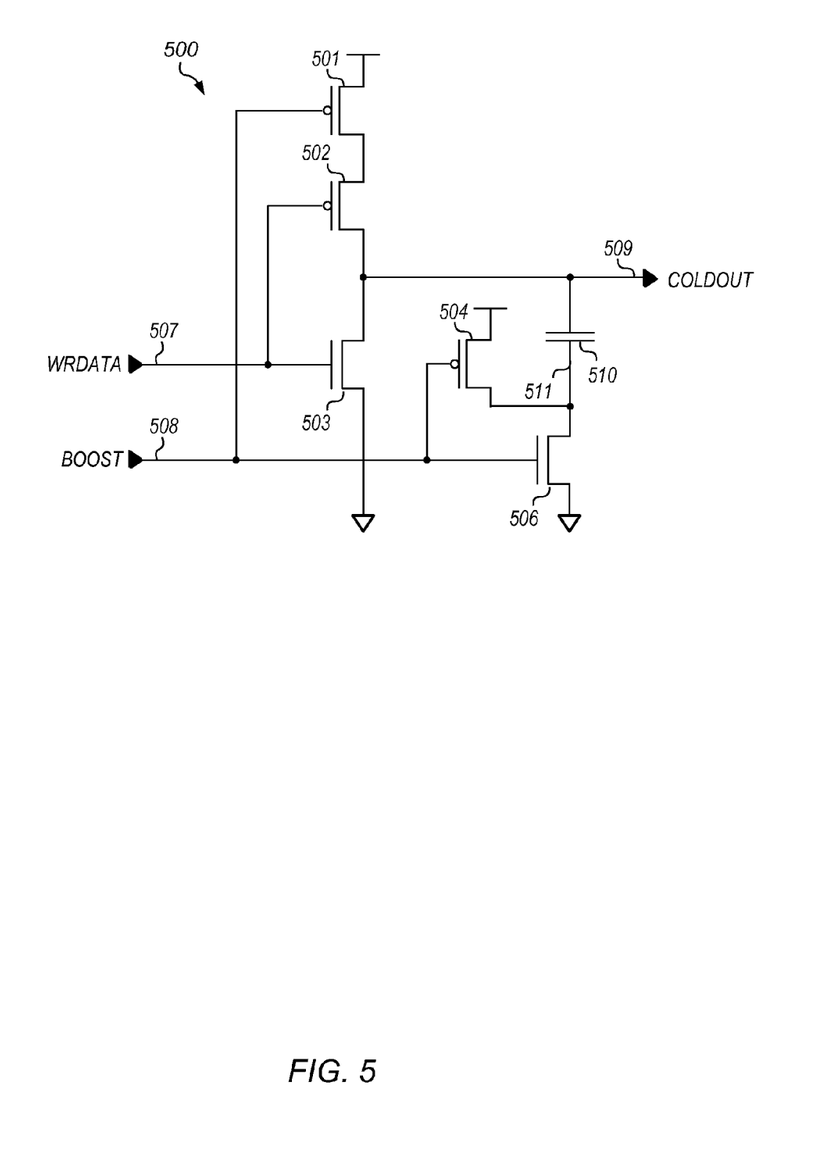
FIG. 5 illustrates an embodiment of a write driver circuit with negative overdrive.

Turning to FIG. 5, an embodiment of a write driver circuit is illustrated. Write driver 500 may, in some embodiments, correspond to write driver circuit 304 of sub-array 300 as illustrated in FIG. 3. In the illustrated embodiment, write driver 500 includes write data signal 507 denoted as "wrdata," boost control signal 508 denoted as "boost," and column data output 509 denoted as "coldout."

The illustrated embodiment includes pull-up device 501 controlled by boost control signal 508. Pull-up device 501 is coupled to device 502 which is controlled by write data signal 507. Device 502 is further coupled column data output 509, which is, in turn, further coupled to pull-down device 503 and capacitor 510. Pull-down device is controlled by write data signal 507.

Capacitor 510 is further coupled to node 511 (also referred to herein as a "boost node"). Node 511 is further coupled to pull-up device 504 and pull-down device 506. Both pull-up device 504 and pull-down device 506 are controlled by boost control signal 508. Capacitor 510 may be implemented as a MOSFET whose source and drain nodes are coupled together. In various other embodiments, capacitor 510 may be implemented as a metal-oxide-metal (MOM) capacitor, a metal-insulator-metal (MIM), or any other suitable capacitor type.

Figure 6:
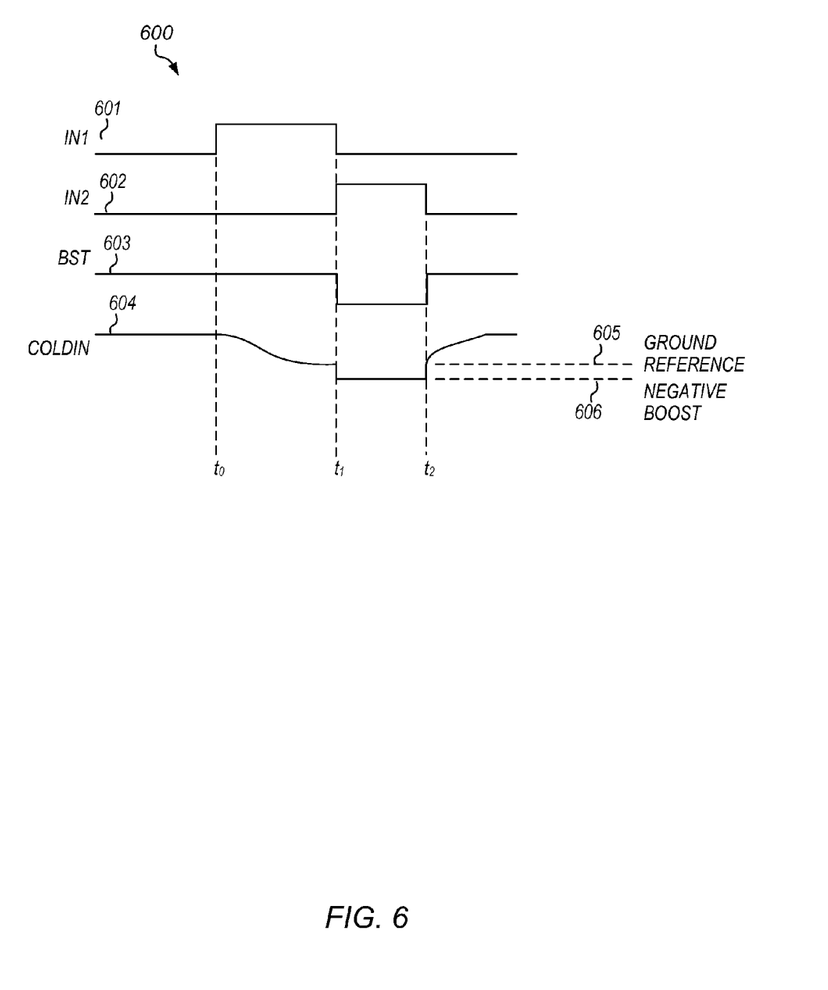
FIG. 6 illustrates example waveforms resulting from the operation of a write driver circuit in a memory device.

Example waveforms that may result from the operation of write driver circuit 500 are illustrated in FIG. 6. Referring collectively to write driver circuit 500 and the waveforms illustrated in FIG. 6, operation begins with write data signal 507 (waveform 601) and boost control signal (waveform 602) at low logic level, resulting in pull-up device 501 and device 502 being activated, resulting in column data output 509 (waveform 604) being charged to the power supply voltage. The low logic level on boost control signal further activates pull-up device 504, thereby charging node 511 (waveform 603) to the power supply voltage.

At time $t_0$, write data signal 507 (waveform 601) transitions to a high logic level. It is noted that in some embodiments, write data control signal 507 may include information resulting from data to be written into a memory device, such as data input 315 as illustrated in FIG. 3, for example, in addition to timing information generated by a timing and control circuit of the memory device, such as, e.g., timing and control block 202 of memory 200 as illustrated in FIG. 2. The high logic level on write data signal 507 deactivates device 502 and activates pull-down device 503, thereby starting a discharge of column data output 509 (waveform 604).

When column data output signal 509 (waveform 604) has discharge to ground (in the example, this occurs at time $t_1$), boost control signal 508 (waveform 602) transitions to a high logic level and write data signal 507 returns to a low logic level. In some embodiments, the delay from time $t_0$ to $t_1$ may be determined by a delay circuit in a timing and control block, such as timing and control block 202 of memory 200, for example. Self-timed circuits utilizing dummy or replica circuits may be employed, in other embodiments, to determine the necessary delay. In other embodiments, a sensor circuit connected to column data output 509 may be employed to determine when to activate boost control signal 508.

When boost control signal 508 transitions to a high logic level, pull-up device 504 is deactivated, and pull-down device 506 is enabled, thereby discharging node 511 (waveform 603) to ground. Since column data input 509 is coupled to node 511 through capacitor 510, column data input 509 responds to the change in voltage level on node 511 by transitioning below ground reference 605 to negative boost level 606. The process of coupling a node below the ground reference is commonly referred to as a "negative boost."

The difference in voltage level between ground reference 605 and negative boost level 606 may, in some embodiments, depend on the value of capacitor 510, the time rate-of-change of node 511, the capacitance of column data output 509, or a combination thereof. In some embodiments, the lower voltage of column data input 509 resulting from the negative boost may result in a larger current being drawn from an internal node of a data storage cell coupled to column data output 509 through a column selection circuit. The larger current may, in some embodiments, allow for reduction in the time necessary to change the logic state of the data storage cell, and may allow for operation at lower power supply voltage levels.

The duration of the negative boost may be dependent upon the value of capacitor 510, the amount of capacitance on column data output 509, parasitic leakage through circuit elements such as, e.g., pull-up device 504, and the like. In some embodiments, a delay circuit, self-timed circuit, or any other suitable circuit may be employed to determine when to deactivate boost control signal 508 (in the example illustrated in FIG. 6, the deactivation of boost control signal 508 occurs at time $t_2$).

At time $t_2$, boost control signal 508 transitions (waveform 602) to a low logic level, deactivating pull-down device 506, and enabling pull-up devices 504 and 501, thereby charging node 511 and column data output 509 to the supply voltage, respectively. Once column data input 509 has returned to the voltage level of the power supply, write driver 500 is ready to be operated again.

It is noted that embodiment illustrated in FIG. 5 and the waveforms depicted in FIG. 6 are merely examples. In other embodiments, different circuit elements and different configurations of elements may be employed, resulting in different waveforms.

Figure 7:
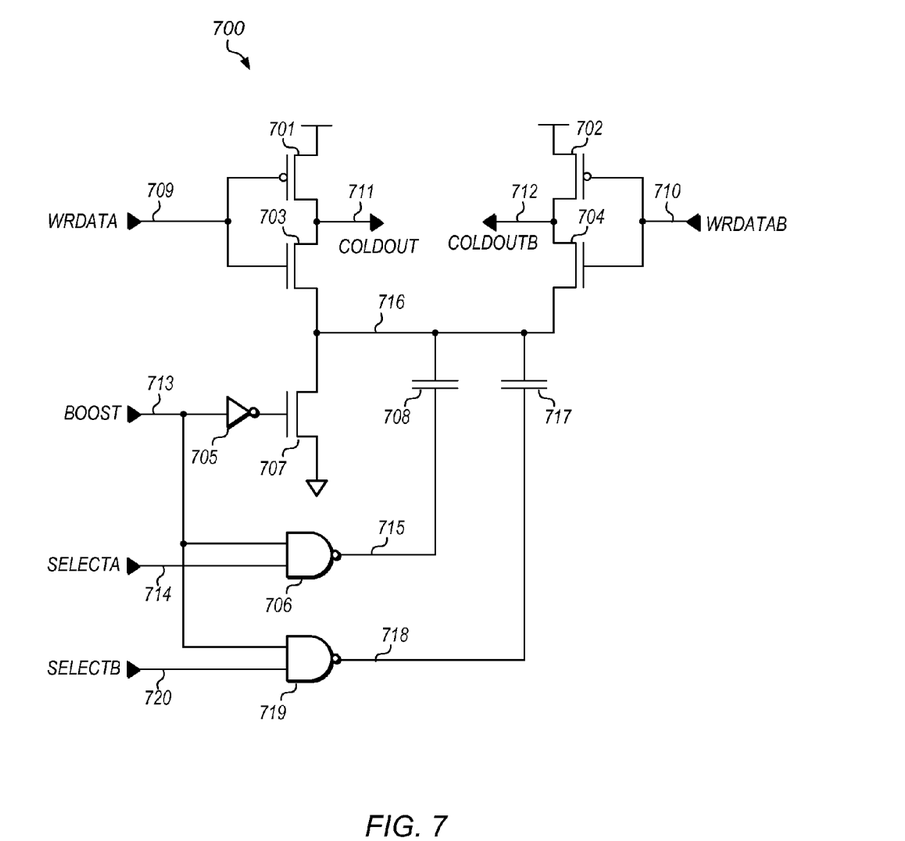
FIG. 7 illustrates an embodiment of two write driver circuits sharing a boost circuit.

A particular embodiment of a write driver circuit that may correspond to write driver 304 in sub-array 300 is illustrated in FIG. 7. In the illustrated embodiment, write driver 700 includes write data signal 709 denoted as "wrdata," complement write data signal 710 denoted as "wrdatab," column data output 711 denoted as "coldout," and complement column data output 712 denoted as "coldoutb." In some embodiments, column data output 711 and complement column data output 712 may correspond to local I/O lines 318 of sub-array 300 as illustrated in FIG. 3. Write driver 700 further includes boost control signal 713 denoted as "boost," selection signal A 714 denoted as "selecta," and selection signal B 720 denoted as "selectb."

Write data signal 709 controls pull-up device 701 and device 703, each of which is coupled to column data output 711. Device 703 is further coupled to common node 716. Complement write data signal 710 controls pull-up device 702 and device 704, each of which is coupled to complement column data output 712. Device 704 is further coupled to common node 716.

Common node 716 is further coupled to pull-down device 707 and capacitors 708 and 717. Pull-down device 707 is controlled by the output of inverter 705, whose input is boost control signal 713. Capacitor 708 is further coupled to the output of NAND gate 706 through node 715, and capacitor 717 is further coupled to the output of NAND gate 719 through node 718. One input of NAND gate 706 is coupled to boost control signal 713 and the other input of NAND gate 706 is coupled to selection signal A 714. In a similar fashion, one input of NAND gate 719 is coupled to boost control signal 713 and the other input of NAND gate 719 is coupled to selection signal B 720.

Static CMOS NAND gates, such as those shown and described herein, may be a particular embodiment of logic circuit including p-channel and n-channel MOSFETs that may be employed in the circuits described herein. However, in other embodiments, any suitable configuration transistors capable of implementing the logical NOT-AND function may be used, including configurations of transistors built using technology other than CMOS.

It is noted that the embodiment illustrated in FIG. 7 is merely an example. In other embodiments, different circuit elements are possible and contemplated.

Figure 8:
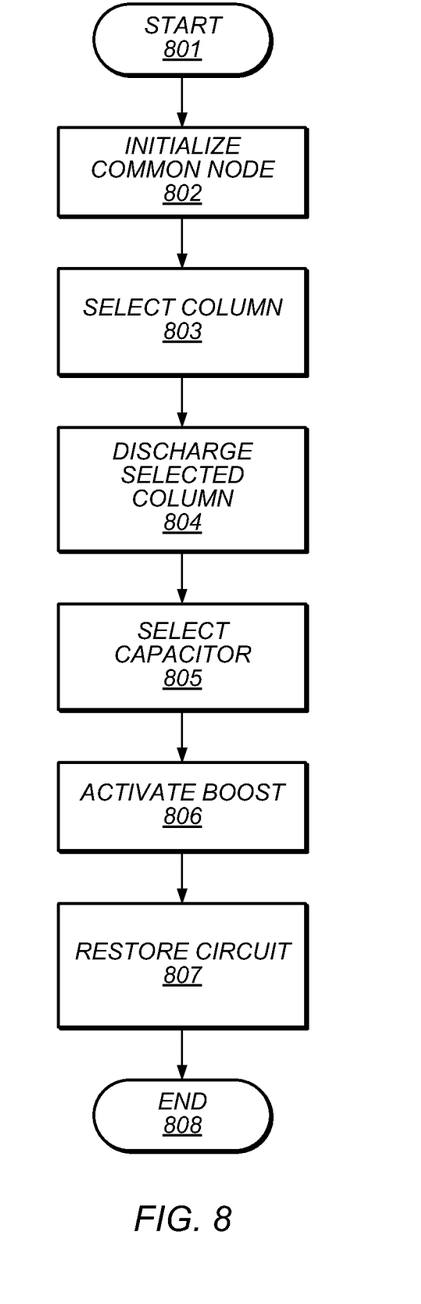
FIG. 8 illustrates a flowchart of an example method of performing a write operation of a memory device.

Turning to FIG. 8, a flowchart depicting a method for operating a write driver circuit, such as write drive 700, is illustrated. Referring collectively to write driver circuit 700 as illustrated in FIG. 7, and the flowchart depicted in FIG. 8, the method begins in block 801. Common node 716 may then be initialized to a pre-determined voltage level (block 802). The pre-determined voltage level may, in some embodiments, be ground potential or any other suitable voltage level. Boost control signal 713 may be set to a low logic level, which may be converted to a high logic level by inverter 705, thereby enabling pull-down device 707. With pull-down device 707 activated, common node 716 is discharged to ground.

A column to be written may then be selected (block 803). Column data output 711 and complement column data output 712 may be coupled to data and complement data ports, respectively, of a column, such as columns 301a through 301d of sub-array 300, for example, through a column selection circuit, such as column mux 302 of sub-array 300. The selection of the column to be written may be dependent upon a decoded address as described above in more detail in reference to FIG. 2 and FIG. 3.

A data line of the selected column may then be discharge (block 804). Dependent upon the polarity of the data to be stored, either write data signal 709 or complement write data signal 710 may be asserted. For example, in the case of storing a logical-0 in a data storage cell coupled to the selected column, write data signal 709 may be asserted, activating device 703, discharging column data output 711 into common node 716. In some embodiments, boost control signal 713 may remain at a low logic level, thereby keeping pull-down device 707 active, assisting in the discharge of column data output 711.

A capacitor for use in generating the negative boost may then be selected (block 805). As described above in reference to FIG. 7, one of selection signal A 714 or selection signal B 720 may be set to a high logic level, thereby enabling NAND gate 715 or NAND gate 719, respectively. In some embodiments, the capacitor value may be selected based on the voltage level of the power supply, electrical characteristics of the memory device, or any other suitable metric. During test mode operation, the write operation may be performed multiple times, each with a different capacitor value in order to characterize one or more data storage cells. In other embodiments, the negative boost may be disabled by not selecting any of the possible capacitor values.

Once a capacitor has been selected for use, the boost portion of the write driver circuit may then be activated (block 806). Boost control signal 713 may be set to a high logic level, which may be converted to a low logic level by inverter 705, thereby deactivating pull-down device 707. Furthermore, the high logic level of boost control signal 713 may cause the output of either NAND gate 706 or NAND gate 719 to transition to a low logic level dependent upon the state of selection signal A 714 and selection signal B 720. The transition to a low logic level on either of nodes 715 or 718 may then couple common node 716 below ground potential (a negative boost) as described above in reference to write driver 500 as illustrated in FIG. 5. In some embodiments, improved write characteristics for a data storage cell coupled to column data output 711 and complement column data output 712 may result when common node 716 is below ground potential.

With the completion of the negative boost, write circuit 700 may be restored to an idle state (block 807). Boost control signal 713 may be returned to a low logic level that may converted to a high logic level by inverter 705, thereby activating pull-down device 707. Common node 716 may then be discharged to ground through pull-down device 707. The low logic level of boost control signal 713 may also transition the output of NAND gates 715 and 719 to a high logic level, preparing nodes 715 and 718 for use in another active period of write circuit 700.

Write data signal 709 or, alternatively, complement write data signal 710 may be transitioned to low logic levels activating pull-up devices 701 and 702, thereby charging column data output 711 and complement column data output 712 to the voltage level of the power supply.

It is noted that in the flowchart illustrated in FIG. 8, the operations are depicted as being performed in a sequential fashion. In other embodiments, some or all of the illustrated operations may be performed in parallel.

Numerous variations and modifications will become apparent to those skilled in the art once the above disclosure is fully appreciated. It is intended that the following claims be interpreted to embrace all such variations and modifications.

What is claimed is:

1. An apparatus, comprising:
a write driver circuit configured to:
  initialize an output node to a first voltage level; and
  discharge the output node to a second voltage level responsive to a write data signal;
  wherein the second voltage level is lower than the first voltage level; and
a boost circuit coupled to the output node, wherein the boost circuit is configured to couple the output node to a third voltage level responsive to a boost control signal, wherein the third voltage level is lower than the second voltage level.

2. The apparatus of claim 1, wherein the boost circuit includes a capacitor, and wherein the capacitor is coupled to the output node and a boost node.

3. The apparatus of claim 2, wherein the boost circuit is further configured to initialize the boost node to the first voltage level.

4. The apparatus of claim 3, wherein to couple the output node to a third voltage level, the boost circuit is further configured to discharge the boost node to the second voltage level.

5. The apparatus of claim 1, wherein the first voltage level is a power supply potential.

6. A method, comprising:
   initializing an output node of a write driver circuit included in a memory circuit to a first voltage level, wherein the output node is coupled to a data line, and wherein the data line is coupled to a plurality of data storage cells;
   discharging the output node to a second voltage level, wherein the second voltage level is lower than the first voltage level; and
   coupling the output node to a third voltage level, wherein the third voltage level is lower than the second voltage level;
   wherein coupling the output node to the third voltage level comprises discharging a selected one of a plurality of boost nodes dependent upon an activation of a respective one of a plurality of selection signals.

7. The method of claim 6, wherein the discharging the output node is responsive to a write data signal.

8. The method of claim 6, wherein coupling the output node to a third voltage level is responsive to a boost control signal.

9. The method of claim 6, wherein coupling the output node to a third voltage level comprises, initializing, to the first voltage level, a boost node coupled to a capacitor, wherein the capacitor is further coupled to the output node.

10. The method of claim 9, wherein the coupling the output node to a third voltage level further comprises, discharging the boost node to the second voltage level.

11. The method of claim 6, wherein discharging the output node comprises:
    initializing a common node to the second voltage level; and
    discharging the output node into the common node.

12. The method of claim 11, wherein the common node is coupled to a second output node.

13. A memory, comprising:
    a data input circuit configured to latch input data to the memory;
    an address decode circuit configured to:
       decode an input address to the memory;
       activate one of a plurality of column selection signals responsive to the decoded input address;
    a plurality of sub-arrays, wherein each sub-array includes:
       a plurality of columns, wherein each column of the plurality of columns includes a plurality of data storage cells;
       a write selection circuit coupled to the plurality of columns, wherein the write selection circuit is configured to select one of the plurality of columns responsive to the activation of a respective one of the plurality of column selection signals;
       a first write driver circuit coupled to a data input of the write selection circuit, wherein the first write driver circuit is configured to discharge the data input of the write selection circuit into a common node dependent upon the latched input data;
       a second write driver circuit coupled to a complement data input of the write selection circuit, wherein the second write driver circuit is configured to discharge the complement data input of the write selection circuit into the common node dependent upon the latched input data; and
       a boost circuit coupled to the common node, wherein the boost circuit is configured to:
          initialize the common node to a first voltage level; and
          couple the common node to a second voltage level, wherein the second voltage level is lower than the first voltage level.

14. The memory of claim 13, wherein the boost circuit comprises a plurality of capacitors, wherein each capacitor of the plurality of capacitors is coupled between the common node and a respective one of a plurality of boost nodes.

15. The memory of claim 14, wherein each capacitor of the plurality of capacitors comprises a metal-oxide semiconductor field-effect transistor (MOSFET).

16. The memory of claim 14, wherein the boost circuit is further configured to initialize each of the plurality of boost nodes to a third voltage level.

17. The memory of claim 16, wherein the boost circuit is further configured to discharge a selected one of the plurality of boost nodes dependent upon the activation of a respective one of a plurality of selection signals.

18. The memory of claim 13, wherein each of the plurality of data storage cells comprises a static random access memory (SRAM) cell.

* * * * *